United States Patent
Lee et al.

(10) Patent No.: US 9,089,072 B2
(45) Date of Patent: Jul. 21, 2015

(54) HEAT RADIATING SUBSTRATE AND METHOD FOR MANUFACTURING THE SAME

(71) Applicant: SAMSUNG ELECTRO-MECHANICS CO., LTD., Suwon (KR)

(72) Inventors: Young Ki Lee, Suwon (KR); Kwang Soo Kim, Suwon (KR); Bum Seok Suh, Suwon (KR); Chang Seob Hong, Suwon (KR); Joon Seok Chae, Suwon (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 169 days.

(21) Appl. No.: 13/753,824

(22) Filed: Jan. 30, 2013

(65) Prior Publication Data

US 2014/0092563 A1     Apr. 3, 2014

(30) Foreign Application Priority Data

Oct. 2, 2012  (KR) .................. 10-2012-0109699

(51) Int. Cl.
*H05K 7/20* (2006.01)
*B23P 15/26* (2006.01)
*H05K 1/02* (2006.01)

(52) U.S. Cl.
CPC . *H05K 7/20* (2013.01); *B23P 15/26* (2013.01); *H05K 1/0201* (2013.01); *H01L 2224/48091* (2013.01); *H01L 2224/73265* (2013.01); *Y10T 29/4935* (2015.01)

(58) Field of Classification Search
CPC ............. H01L 2224/73265; H01L 33/62; H01L 2224/131; H01L 2224/16145; H01L 2224/73263; H01L 25/0657; H01L 2924/1305; H01L 2924/14; H01L 2225/1023; H01L 23/295; H01L 23/3736; H01L 27/12; H01L 27/1255; H01L 2224/75253; H01L 2224/83862; H01L 2225/06572; H01L 2225/06582; H01M 10/5004; H01M 10/5046; H01M 10/5044; H01M 10/5097; H01M 8/249; B05D 7/50; B32B 2307/202; B32B 2457/14; F21V 23/02; F21V 29/004; F21V 19/0045; F21V 23/004; F21V 29/22; F21V 7/20; H05K 1/144; H05K 1/181; H05K 1/185; H05K 3/341; H05K 1/0203; H05K 1/0206; H05K 1/021; H05K 1/023; H05K 1/0271; H05K 2201/06; H05K 2201/09072; H05K 2201/09827; H05K 2201/10007; H05K 2201/1053; H05K 2201/10969; H05K 3/30; H05K 3/32; H05K 3/381; H05K 9/0022

USPC ......... 361/702–722, 803, 728, 748, 761, 779; 174/252, 260, 255; 257/706–731, 675, 257/71

See application file for complete search history.

(56) References Cited

U.S. PATENT DOCUMENTS 6,320,776 B1 * 11/2001 Kajiura et al. ............... 363/141
6,432,750 B2    8/2002 Jeon et al.

(Continued)

FOREIGN PATENT DOCUMENTS

KR         10-1037470        5/2011
KR    10-2011-0082895        7/2011

OTHER PUBLICATIONS

Office action dated Dec. 4, 2013 from corresponding Korean Patent Application No. 10-2012-0109699 and its English summary provided by the clients.

*Primary Examiner* — Hoa C Nguyen
*Assistant Examiner* — Michael Matey
(74) *Attorney, Agent, or Firm* — Ladas & Parry, LLP (57) ABSTRACT

Disclosed herein is a heat radiating substrate including: a heat radiating plate including a plurality of holes having a predetermined depth and formed in a lower portion of one side thereof; a conductor pattern layer formed on the heat radiating plate and including a mounting pad on which a control device and a power device are mounted and a circuit pattern; and an insulating layer formed between the heat radiating plate and the conductor pattern layer.

12 Claims, 6 Drawing Sheets

(56) References Cited

U.S. PATENT DOCUMENTS

| | | | |
|---|---|---|---|
| 2009/0166850 A1* | 7/2009 | Jeon et al. | 257/706 |
| 2009/0174044 A1* | 7/2009 | Eom et al. | 257/675 |
| 2009/0194857 A1* | 8/2009 | Liu et al. | 257/676 |
| 2009/0218665 A1* | 9/2009 | Yang | 257/676 |
| 2009/0243079 A1* | 10/2009 | Lim et al. | 257/691 |
| 2009/0244848 A1* | 10/2009 | Lim et al. | 361/709 |
| 2010/0091460 A1* | 4/2010 | Hinze et al. | 361/709 |
| 2010/0208427 A1* | 8/2010 | Horiuchi et al. | 361/699 |
| 2011/0090649 A1* | 4/2011 | Chan et al. | 361/709 |
| 2012/0127666 A1* | 5/2012 | Park et al. | 361/709 |

\* cited by examiner

HEAT RADIATING SUBSTRATE AND METHOD FOR MANUFACTURING THE SAME

CROSS REFERENCE TO RELATED APPLICATION

This application claims the benefit of Korean Patent Application No. 10-2012-0109699, filed on Oct. 2, 2012, entitled "Heat Radiating Substrate and Method for Manufacturing the Same", which is hereby incorporated by reference in its entirety into this application.

BACKGROUND OF THE INVENTION

1. Technical Field

The present invention relates to a heat radiating substrate and a method for manufacturing the same.

2. Description of the Related Art

Recently, in accordance with the development of the electronic industry, a demand for multi-functional electronic components has been rapidly increased. In addition, in accordance with slimness and lightness of the electronic components, in a circuit board having the electronic components mounted thereon, many electronic components should be integrated on a small area of the circuit board.

Meanwhile, the circuit board is mounted with a high temperature heating element generating heat such as a power device, a light emitting device (LED), or the like. In the case in which heat generated by the high temperature heating element is not rapidly radiated, a temperature of the circuit board increases, which causes inoperable state and malfunction of the heating element. Therefore, research into a heat radiating substrate, which is a circuit board having improved heat radiation characteristics, has been conducted.

In a heat radiating substrate according to the prior art, a power device radiating high heat and a control device vulnerable to the heat are simultaneously mounted on a heat radiating plate (U.S. Pat. No. 6,432,750). In addition, the heat radiating plate is made of a material having excellent thermal conductivity in order to radiate heat of the power device. In this case, since the power device and the control device are mounted on a single heat radiating plate, heat generated in the power device may be conducted to the control device through the heat radiating plate. Therefore, the control device is affected by the heat generated in the power device to cause malfunction.

SUMMARY OF THE INVENTION

The present invention has been made in an effort to provide a heat radiating substrate capable of preventing defects of a control device by reducing heat generated in a power device and conducted to the control device, and a method for manufacturing the same.

The present invention has been also made in an effort to provide a heat radiating substrate capable of improving reliability of a package at the time of packaging devices by reducing heat generated in a power device and conducted to the control device, and a method for manufacturing the same.

According to a preferred embodiment of the present invention, there is provided a heat radiating substrate including: a heat radiating plate including a plurality of holes having a predetermined depth and formed in a lower portion of one side thereof; a conductor pattern layer formed on the heat radiating plate and including mounting pads on which a control device and a power device are mounted and a circuit pattern; and an insulating layer formed between the heat radiating plate and the conductor pattern layer.

The heat radiating plate may include: a first heat radiating part including the control device mounted thereon and the plurality of holes having a predetermined depth and formed in a lower portion thereof; and a second heat radiating part formed integrally with the first heat radiating part at a side of the first heat radiating part and including the power device mounted thereon.

The heat radiating plate may be made of a non-metal inorganic material such as ceramic or diamond.

The heat radiating plate may be made of at least one of aluminum (Al), copper (Cu), molybdenum (Mo), tungsten (W), titanium (Ti), and magnesium (Mg).

An internal portion of the plurality of holes may be filled with a heterogeneous material having thermal conductivity lower than that of the heat radiating plate.

An internal portion of the plurality of holes may be filled with an epoxy resin.

According to another preferred embodiment of the present invention, there is provided a method for manufacturing a heat radiating substrate including: preparing a heat radiating base plate; forming a plurality of holes having a predetermined depth in a lower portion of one side of the heat radiating base plate to form a heat radiating plate; forming an insulating layer on the heat radiating plate; and forming a conductor pattern layer including mounting pads on which a control device and a power device are mounted and a circuit pattern on the insulating layer.

In the preparing of the heat radiating base plate, the heat radiating base plate may be made of a non-metal inorganic material such as ceramic or diamond.

In the preparing of the heat radiating base plate, the heat radiating base plate may be made of at least one of aluminum (Al), copper (Cu), molybdenum (Mo), tungsten (W), titanium (Ti), and magnesium (Mg).

In the forming of the heat radiating plate, the plurality of holes may be formed by a drilling process.

The method for manufacturing a heat radiating substrate may further include filling a heterogeneous material having thermal conductivity lower than that of the heat radiating plate in the plurality of the holes after the forming of the heat radiating plate.

In the filling of the heterogeneous material, the heterogeneous material may be an epoxy resin.

In the forming of the conductor pattern layer, a mounting pad on which the control device is mounted may be formed on the plurality of holes of the heat radiating plate.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

Figure 1:
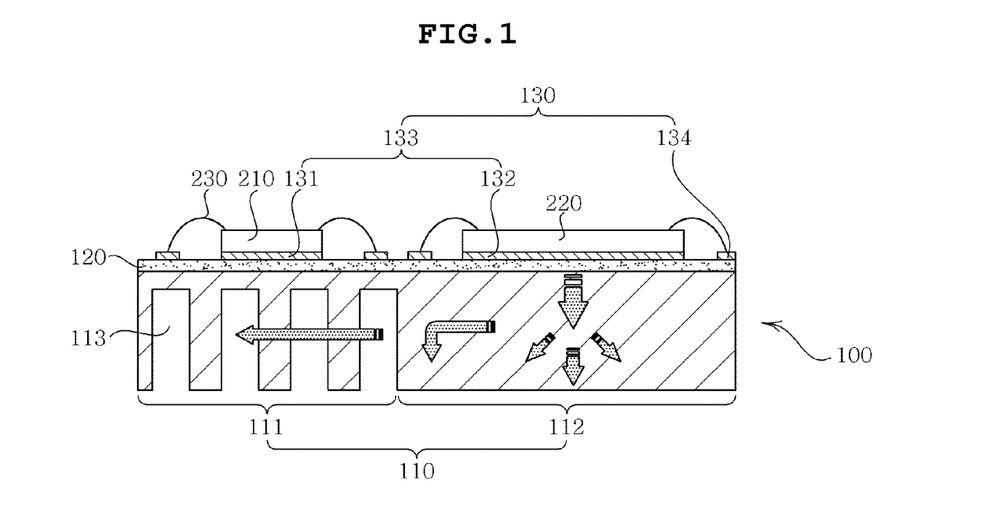
FIG. 1 is an exemplary view showing a side of a heat radiating substrate according to a preferred embodiment of the present invention.

FIG. 1 is an exemplary view showing a side of a heat radiating substrate according to a preferred embodiment of the present invention.

Referring to FIG. 1, a heat radiating substrate 100 may be configured to include a heat radiating plate 110, an insulating layer 120, and a conductor pattern layer 130.

The heat radiating plate 110 is a component radiating heat generated from a control device 210 or a power device 220 to the outside. In the heat radiating plate 110 according to the preferred embodiment of the present invention, a plurality of holes 113 having a predetermined depth may be formed in a lower portion of one side thereof. More specifically, the heat radiating plate 110 according to the preferred embodiment of the present invention may include a first heat radiating part 111 and a second heat radiating part 112.

The first heat radiating part 111 may include the control device 210 mounted thereon. In addition, a lower portion of the first heat radiating part 111 may be formed with the plurality of holes 113 having a predetermined depth. Although the case in which the plurality of holes 113 are formed to be space apart from an upper surface of the first heat radiating part 111 is shown in the preferred embodiment of the present invention, the present invention is not limited thereto. For example, the plurality of holes 113 may be formed up to the upper surface of the first heat radiating part 111, thereby having a structure in which the plurality of holes 113 penetrate through the first heat radiating part 111.

The second heat radiating part 112 may include the power device 220 mounted thereon. The second heat radiating part 112 may be formed at a side of the first heat radiating part 111. Further, the second heat radiating part 112 may be formed integrally with the first heat radiating part 111. Although the case in which the second heat radiating part 112 is formed integrally with the first heat radiating part 111 at one side thereof is shown in the preferred embodiment of the present invention, the present invention is not limited thereto. That is, the number and position of the second heat radiating part 112 may be differently designed by those skilled in the art as needed.

The heat radiating plate 110 may be made of a material having high thermal conductivity. For example, the heat radiating plate 110 may be made of at least one of aluminum (Al), copper (Cu), molybdenum (Mo), tungsten (W), titanium (Ti), and magnesium (Mg). Alternatively, the heat radiating plate 110 may be made of a non-metal inorganic material such as ceramic or diamond.

The insulating layer 120 may be formed on the heat radiating plate 110. The insulating layer 120 may be formed for electrical insulation between the heat radiating plate 110 and the conductor pattern layer 130. The insulating layer 120 may be formed on the entire surface of an upper portion of the heat radiating plate 110. Alternatively, the insulating layer 120 may be formed on the heat radiating plate 110 only under the conductor pattern layer 130. The insulating layer 120 may be made of an epoxy based organic insulating material. Alternatively, the insulating layer 120 may be made of an anodic oxide film. However, a material of the insulating layer 120 is not limited thereto, but may be made of any insulating material known in the art.

The conductor pattern layer 130 may be formed on the insulating layer 120. The control device 210 and the power device 220 may be directly mounted on the conductor pattern layer 130. In addition, the conductor pattern layer 130 may be electrically connected to the control device 210 and the power device 220. The conductor pattern layer 130 may be made of an electrically conductive metal.

The conductor pattern layer 130 may include a mounting pad 133 and a circuit pattern 134. The mounting pad 133 is a component on which the control device 210 and the power device 220 are mounted. The mounting pad 133 may include first and second mounting pads 131 and 132. The first mounting pad 131 may include the control device 210 mounted thereon. The first mounting pad 131 may be formed on the first heat radiating part 111. The second mounting pad 132 may include the power device 220 mounted thereon. The second mounting pad 132 may be formed on the second heat radiating part 112. The circuit pattern 134 may be electrically connected to the power device 220 and the control device by a wire 230 or a lead frame (not shown).

The heat radiating substrate 100 according to the preferred embodiment of the present invention is used in a device package. The power device 220 radiating heat and the control device 210 having a low operation temperature may be simultaneously mounted on the heat radiating substrate 100 of the package. The heat radiating substrate 100 according to the present invention may include the plurality of holes 113 formed at an area on which the control device 210 is mounted. The heat generated in the power device 220 and conducted to the control device 210 through the heat radiating plate 110 may be reduced by the plurality of holes 113 formed as described above. Therefore, the heat radiating substrate 100 according to the preferred embodiment of the present invention may protect the control device 210 from the heat generated from the power device 220.

Figure 2:
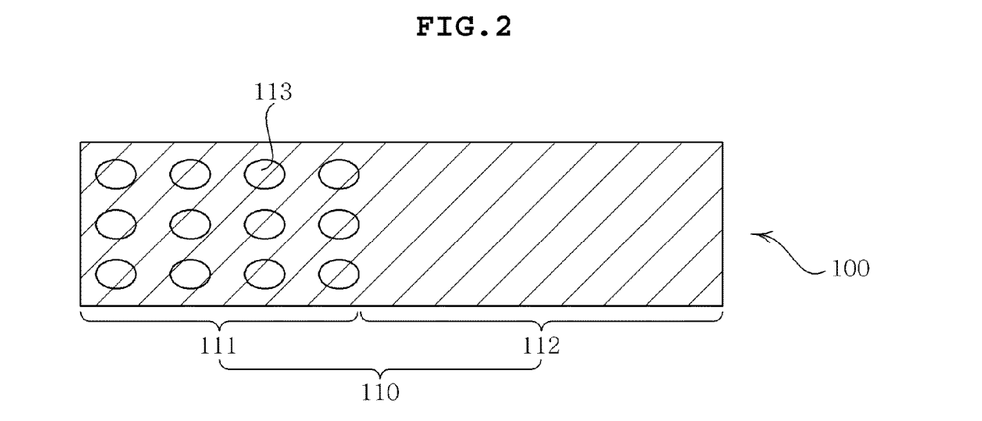
FIG. 2 is an exemplary view showing a lower portion of the heat radiating substrate according to the preferred embodiment of the present invention.

FIG. 2 is an exemplary view showing a lower portion of the heat radiating substrate according to the preferred embodiment of the present invention.

Referring to FIG. 2, the lower portion of the heat radiating plate 110 among components configuring the heat radiating substrate 100 may be confirmed. According to the preferred embodiment of the present invention, the lower portion of the heat radiating plate 110 may be formed with the plurality of holes 113. Although the case in which the plurality of holes are formed to have a circular cross-section is shown in FIG. 2, the present invention is not limited thereto. That is, the plurality of holes 113 may be easily formed by those skilled in the art so as to have a polygonal cross-section as well as the circular cross-section.

Figure 3:
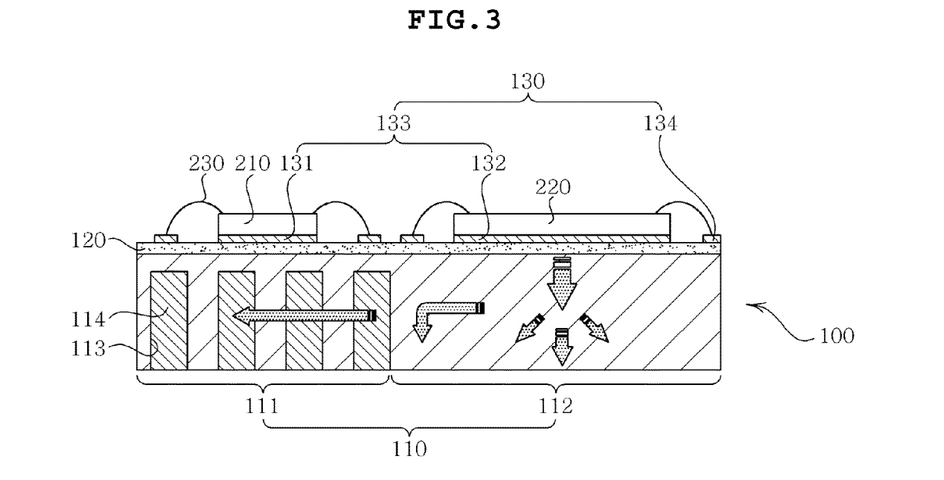
FIG. 3 is an exemplary view showing a side of a heat radiating substrate according to another preferred embodiment of the present invention.

FIG. 3 is an exemplary view showing a side of a heat radiating substrate according to another preferred embodiment of the present invention.

Referring to FIG. 3, a heat radiating substrate 100 may be configured to include a heat radiating plate 110, an insulating layer 120, and a conductor pattern layer 130.

The heat radiating plate 110 is a component radiating heat generated from a control device 210 or a power device 220 to the outside. In the heat radiating plate 110 according to the preferred embodiment of the present invention, a plurality of holes 113 having a predetermined depth may be formed in a lower portion of one side thereof. More specifically, the heat radiating plate 110 according to the preferred embodiment of the present invention may include a first heat radiating part 111 and a second heat radiating part 112.

The first heat radiating part 111 may include the control device 210 mounted thereon. In addition, a lower portion of the first heat radiating part 111 may be formed with the plurality of holes 113 having a predetermined depth. Although the case in which the plurality of holes 113 are formed to be space apart from an upper surface of the first heat radiating part 111 is shown in the preferred embodiment of the present invention, the present invention is not limited thereto. For example, the plurality of holes 113 may be formed up to the upper surface of the first heat radiating part 111, thereby having a structure in which the plurality of holes 113 penetrate through the first heat radiating part 111.

An internal portion of the plurality of holes 113 may be filled with a heterogeneous material 114, which is a different material from that of the heat radiating plate 110. Here, the heterogeneous material 114 may be a material having thermal conductivity lower than that of the heat radiating plate 110. For example, the heterogeneous material 114 may be an epoxy resin. The heterogeneous material 114 filled in the internal portion the plurality of holes 113 may reduce conduction of heat generated in the power device 220 to the control device 210 through the heat radiating plate 110. In addition, the heterogeneous material 114 is filled in the internal portion of the plurality of holes 113, such that a mechanical problem that may be generated by forming the plurality of holes 113 may be solved and reliability may be improved.

The second heat radiating part 112 may include the power device 220 mounted thereon. The second heat radiating part 112 may be formed a side of the first heat radiating part 111. Further, the second heat radiating part 112 may be formed integrally with the first heat radiating part 111. Although the case in which the second heat radiating part 112 is formed integrally with the first heat radiating part 111 at one side thereof is shown in the preferred embodiment of the present invention, the present invention is not limited thereto. That is, the number and position of second heat radiating part 112 may be differently designed by those skilled in the art as needed. Since the power device 220 is mounted on the second heat radiating part 112, the second heat radiating part 112 needs to have high thermal conductivity in order to maximally radiate the heat generated in the power device 220 to the outside. Therefore, the second heat radiating part 112 may be made of only metals having high thermal conductivity.

The heat radiating plate 110 may be made of a material having high thermal conductivity. For example, the heat radiating plate 110 may be made of at least one of aluminum (Al), copper (Cu), molybdenum (Mo), tungsten (W), titanium (Ti), and magnesium (Mg). Alternatively, the heat radiating plate 110 may be made of a non-metal inorganic material such as ceramic or diamond.

The insulating layer 120 may be formed on the heat radiating plate 110. The insulating layer 120 may be formed for electrical insulation between the heat radiating plate 110 and the conductor pattern layer 130. The insulating layer 120 may be formed on the entire surface of an upper portion of the heat radiating plate 110. Alternatively, the insulating layer 120 may be formed on the heat radiating plate 110 only under the conductor pattern layer 130. The insulating layer 120 may be made of an epoxy based organic insulating material. Alternatively, the insulating layer 120 may be made of an anodic oxide film. However, a material of the insulating layer 120 is not limited thereto, but may be made of any insulating material known in the art.

The conductor pattern layer 130 may be formed on the insulating layer 120. The control device 210 and the power device 220 may be directly mounted on the conductor pattern layer 130. In addition, the conductor pattern layer 130 may be electrically connected to the control device 210 and the power device 220. The conductor pattern layer 130 may be made of an electrically conductive metal.

The conductor pattern layer 130 may include a mounting pad 133 and a circuit pattern 134. The mounting pad 133 is a component on which the control device 210 and the power device 220 are mounted. The mounting pad 133 may include first and second mounting pads 131 and 132. The first mounting pad 131 may include the control device 210 mounted thereon. The first mounting pad 131 may be formed on the first heat radiating part 111. The second mounting pad 132 may include the power device 220 mounted thereon. The second mounting pad 132 may be formed on the second heat radiating part 112. The circuit pattern 134 may be electrically connected to the power device 220 and the control device 210 by a wire 230 or a lead frame (not shown).

The heat radiating substrate 100 according to the present invention may include the plurality of holes 113 formed in an area on which the control device 210 is mounted. In this case, the heterogeneous material 114 having thermal conductivity lower than that of the heat radiating plate 110 is present in the plurality of holes 113. That is, the heat generated in the power device 220 and conducted to the control device 210 through the heat radiating plate 110 may be reduced by the plurality of holes 113 formed so as to have thermal conductivity lower than that of the heat radiating plate 110. Therefore, the heat radiating substrate 100 according to the preferred embodiment of the present invention may protect the control device 210 from the heat generated from the power device 220.

Figure 4:
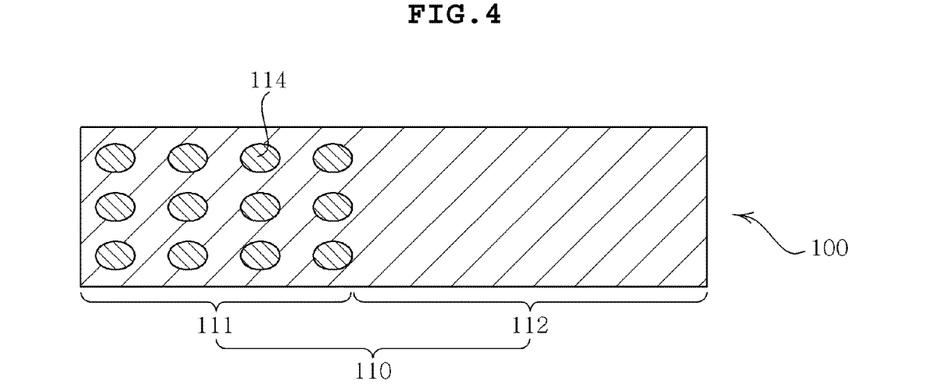
FIG. 4 is an exemplary view showing a lower portion of the heat radiating substrate according to another preferred embodiment of the present invention.

FIG. 4 is an exemplary view showing a lower portion of the heat radiating substrate according to another preferred embodiment of the present invention.

Referring to FIG. 4, the lower portion of the heat radiating plate 110 among components configuring the heat radiating substrate 100 may be confirmed. According to the preferred embodiment of the present invention, the lower portion of the heat radiating plate 110 may be formed with the plurality of holes 113. Further, the heterogeneous material 114 may be filled in the plurality of holes 113. Here, the heterogeneous material 114 may be a material having thermal conductivity lower than that of the heat radiating plate 110. For example, the heterogeneous material 114 may be an epoxy resin. Although the case in which the plurality of holes are formed to have a circular cross-section is shown in FIG. 4, the present invention is not limited thereto. That is, the plurality of holes 113 may be easily formed by those skilled in the art so as to have a polygonal cross-section as well as the circular cross-section.

FIGS. 5 to 9 are exemplary views showing a method for manufacturing the heat radiating substrate according to the preferred embodiment of the present invention.

Figure 5:
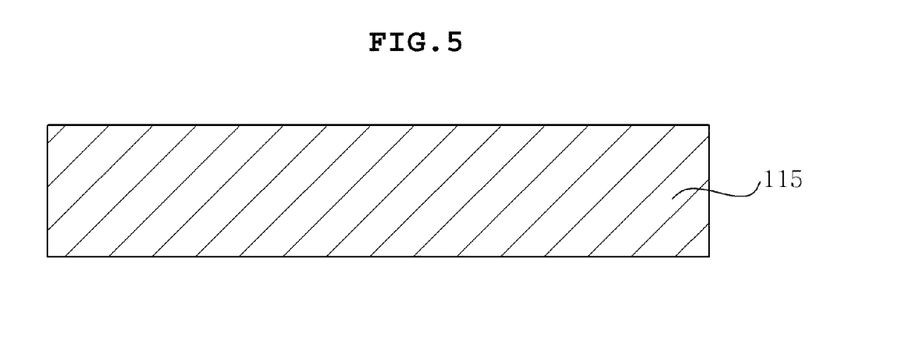
FIGS. 5 to 9 are exemplary views showing a method for manufacturing the heat radiating substrate according to the preferred embodiment of the present invention.

Referring to FIG. 5, a heat radiating base plate 115 may be prepared. The heat radiating base plate 115 may be made of a material having high thermal conductivity. For example, the heat radiating base plate 115 may be made of at least one of aluminum (Al), copper (Cu), molybdenum (Mo), tungsten (W), titanium (Ti), and magnesium (Mg). Alternatively, the heat radiating base plate 115 may be made of a non-metal inorganic material such as ceramic or diamond.

Figure 6:
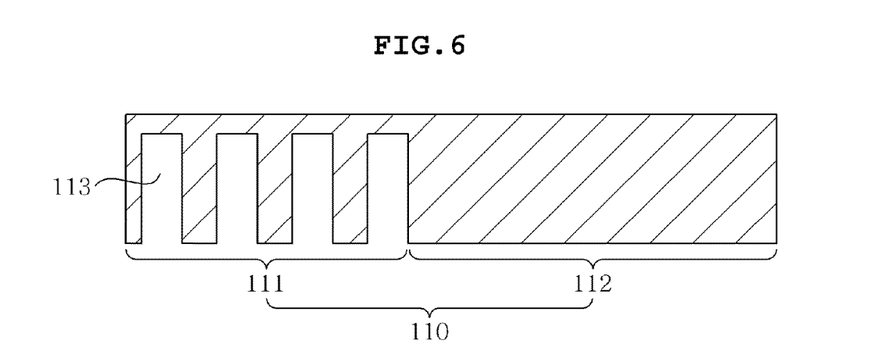

Referring to FIG. 6, a plurality of holes 113 may be formed in the heat radiating base substrate 115. The plurality of holes 113 may be formed to have a predetermined depth in a lower portion of a first heat radiating part 111. Here, the first heat radiating part 111 may be one side area of the heat radiating base plate 115 on which a control device (210 in FIG. 9) will be mounted later. Although the case in which the plurality of holes 113 are formed to be space apart from an upper surface of the first heat radiating part 111 is shown in the preferred embodiment of the present invention, the present invention is not limited thereto. For example, the plurality of holes 113 may be formed up to the upper surface of the first heat radiating part 111, thereby having a structure in which the plurality of holes 113 penetrate through the first heat radiating part 111. The plurality of holes 113 may be formed through a drilling process.

As described above, the plurality of holes 113 are formed in the lower portion of one side of the heat radiating base plate, such that a heat radiating plate 110 having a structure according to the preferred embodiment of the present invention may be formed. The heat radiating plate 110 according to the preferred embodiment of the present invention may be divided into a first heat radiating part 111 on which the control device (210 in FIG. 9) will be mounted later and a second heat radiating part 112 on which a power device (220 in FIG. 9) will be mounted later.

Figure 7:
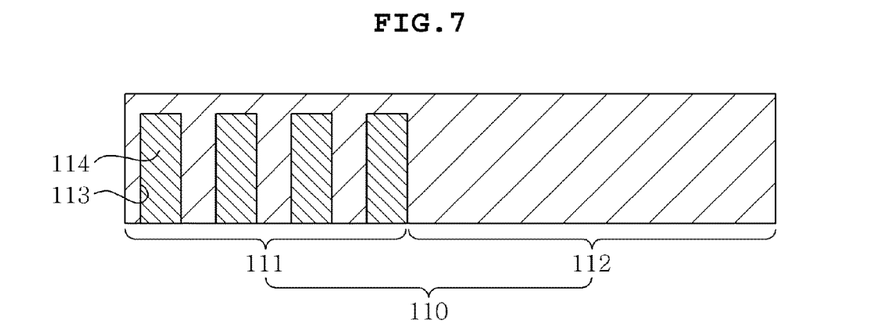

Referring to FIG. 7, a heterogeneous material 114 may be filled in the plurality of holes 113 of the heat radiating plate 110. Here, the heterogeneous material 114 may be a material having thermal conductivity lower than that of the heat radiating plate 110. For example, the heterogeneous material 114 may be an epoxy resin. The heterogeneous material 114 filled in the plurality of holes 113 may reduce heat generated in the power device 220 and conducted to the control device 210 through the heat radiating plate 110. In addition, the heterogeneous material 114 is filled in the internal portion of the plurality of holes 113, such that a mechanical problem that may be generated by forming the plurality of holes 113 may be solved and reliability may be improved.

Figure 8:
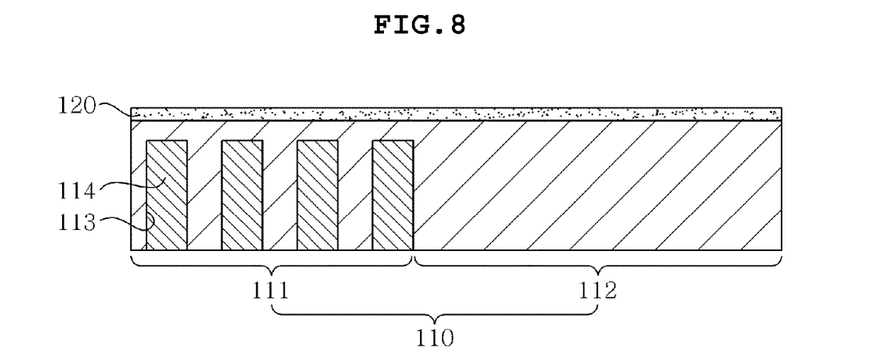

Referring to FIG. 8, an insulating layer 120 may be formed on an upper portion of the heat radiating plate 110. The insulating layer 120 may be formed on the entire surface of the upper portion of the heat radiating plate 110. Alternatively, the insulating layer 120 may be formed on the heat radiating plate 110 only under the conductor pattern layer 130. In this case, after the insulating layer 120 may be formed on the entire surface of the upper portion of the heat radiating plate 110, the insulating layer 120 may be patterned so as to be formed under the conductor pattern layer 130. The insulating layer 120 may be formed by a known method. The insulating layer 120 may be made of an epoxy based organic insulating material. Alternatively, the insulating layer 120 may be made of an anodic oxide film. However, a material of the insulating layer 120 is not limited thereto, but may be made of any insulating material known in the art.

Figure 9:
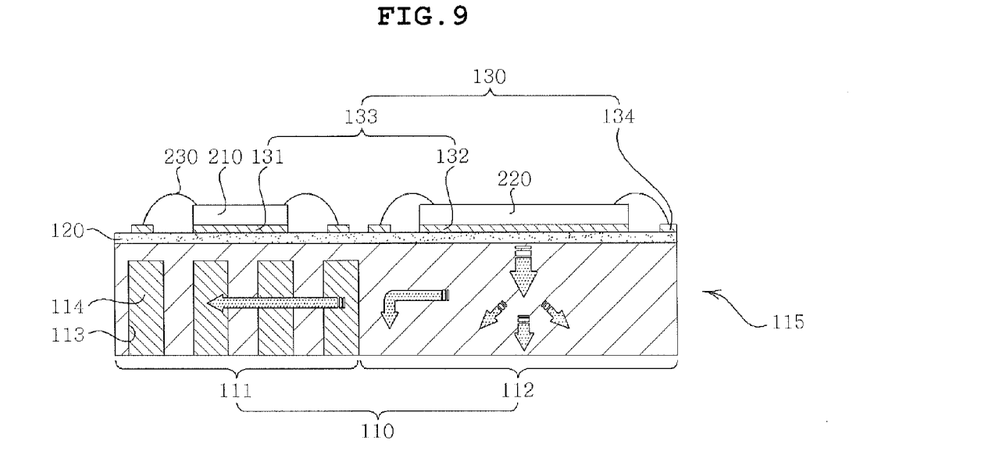

Referring to FIG. 9, a conductor pattern layer 130 may be formed on the insulating layer 120. The conductor pattern layer 130 may include a mounting pad 133 and a circuit pattern 134. Here, the mounting pad 133 may include first and second mounting pads 131 and 132. The first mounting pad 131 may include the control device 210 mounted thereon. The first mounting pad 131 may be formed on the first heat radiating part 111. The second mounting pad 132 may include the power device 220 mounted thereon. The second mounting pad 132 may be formed on the second heat radiating part 112. The circuit pattern 134 may be electrically connected to the power device 220 and the control device by a wire 230 or a lead frame (not shown).

The conductor pattern layer 130 may be made of an electrically conductive metal. As a metal configuring the conductor pattern layer 130, any kind of metal having electric conductivity may be used with being particularly limited. However, copper or a copper alloy may be generally used. A method for forming the conductor pattern layer 130 is not also particularly limited, but the conductor pattern layer 130 may be formed by a known method. For example, the conductor pattern layer 130 may be formed by an electroless plating method and an electroplating method.

In the preferred embodiment of the present invention, filling the heterogeneous material 114 in the plurality of holes 113 of the heat radiating plate 110 is included, but the present invention is not limited thereto. The heterogeneous material 114 is made of a material having thermal conductivity lower than that of the heat radiating plate 110 and serves to suppress heat generated in the power device 220 from being conducted to the control device 210 through the heat radiating plate 110. In the case in which the heat radiating plate 110 has thermal conductivity higher than that of air, the filling of the heterogeneous material 114 in the plurality of holes 113 may be omitted. That is, since air present in the plurality of holes 113 has thermal conductivity lower than that of the heat radiating plate 110, the air may serve to prevent heat of the power device 220 from being conducted to the control device 210. Therefore, the filling of the heterogeneous material 114 in the plurality of holes 113 of the heat radiating plate 110 may be easily omitted or added by those skilled in the art.

Figure 10:
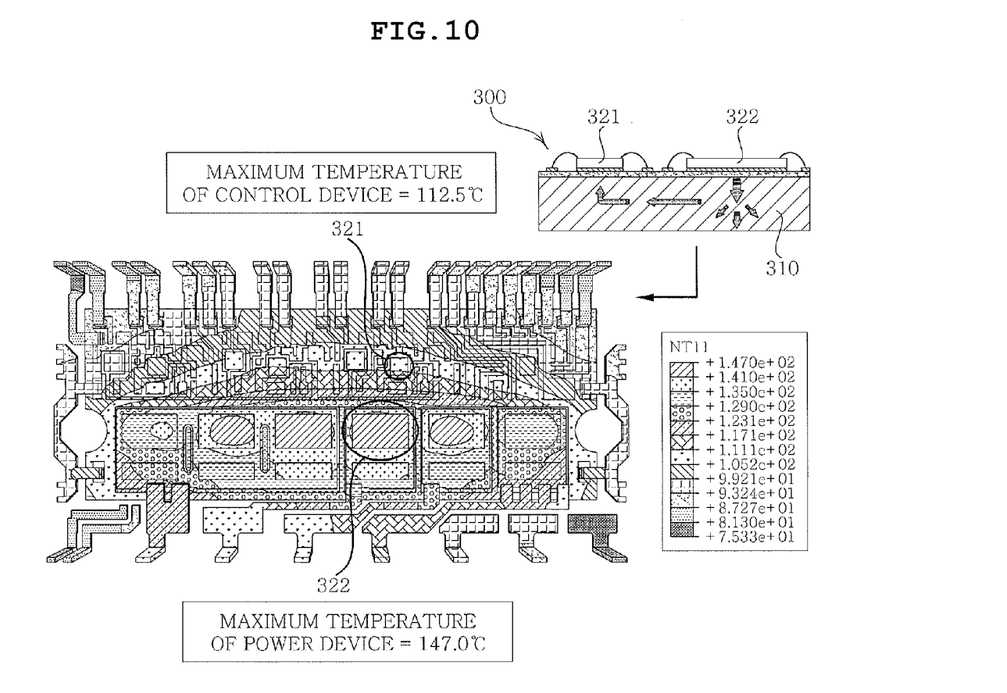
FIG. 10 is an exemplary view showing a thermal analysis simulation result of a heat radiating substrate according to the prior art.

FIG. 10 is an exemplary view showing a thermal analysis simulation result of a heat radiating substrate according to the prior art.

Referring to FIG. 10, in a heat radiating substrate 300 according to the prior art, a power device 322 and a control device 321 are both mounted on a single heat radiating plate 310. Here, when a maximum temperature of the power device is 147.0° C., a maximum temperature of the control device becomes 112.5° C. That is, a temperature difference between the power device 322 and the control device 321 becomes 34.5° C.

Figure 11:
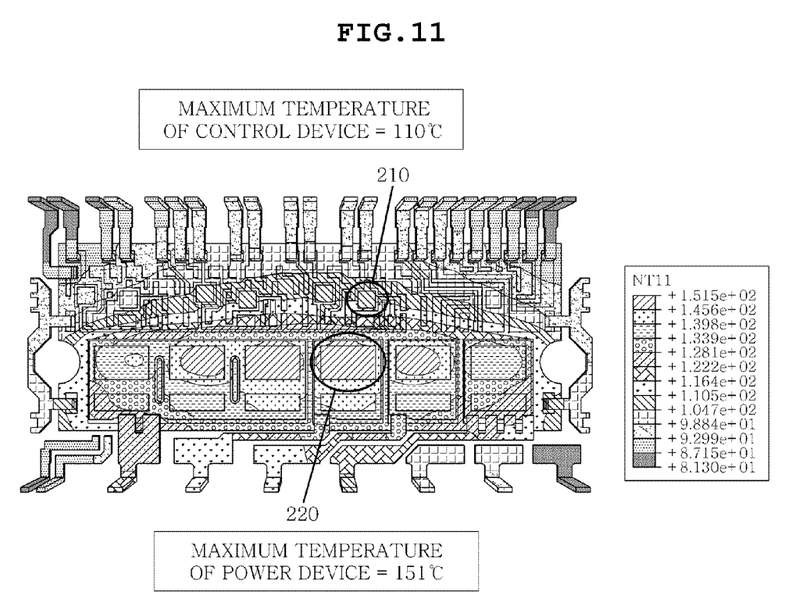
FIG. 11 is an exemplary view showing a thermal analysis simulation result of the heat radiating substrate according to the preferred embodiment of the present invention.

FIG. 11 is an exemplary view showing a thermal analysis simulation result of the heat radiating substrate according to the preferred embodiment of the present invention.

Referring to FIG. 11, in the heat radiating substrate 100 of FIG. 1 according to the preferred embodiment of the present invention, the holes 113 may be formed in the lower portion of the first heat radiating part 111 on which the control device 210 is mounted. In this case, when a maximum temperature of the power device 220 is 151° C., a maximum temperature of the control device 210 may become 110° C. That is, a temperature difference between the power device 220 and the control device 210 becomes 41° C. As compared to the temperature difference between the power device 322 and the control device 321 of the heat radiating substrate 300 of FIG. 10 according to the prior art, the heat radiating substrate 100 of FIG. 1 according to the preferred embodiment of the present invention has higher efficiency in thermal separation between the power device 220 and the control device 210.

Figure 12:
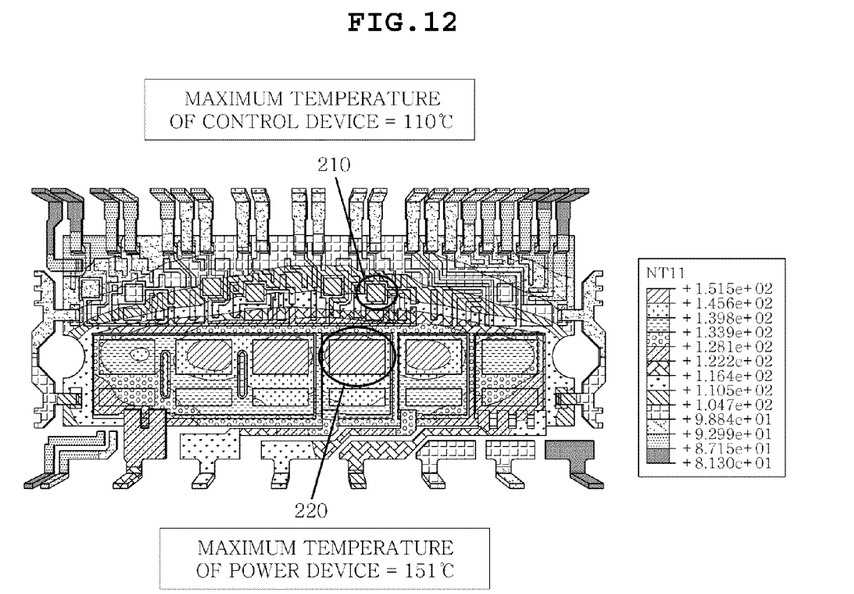
FIG. 12 is an exemplary view showing a thermal analysis simulation result of the heat radiating substrate according to another preferred embodiment of the present invention.

FIG. 12 is an exemplary view showing a thermal analysis simulation result of the heat radiating substrate according to another preferred embodiment of the present invention.

Referring to FIG. 12, in the heat radiating substrate 100 of FIG. 3 according to the preferred embodiment of the present invention, the holes 113 may be formed in the lower portion of the first heat radiating part 111 on which the control device 210 is mounted. In addition, the holes 113 may be filled with the heterogeneous material 114. In this case, when a maximum temperature of the power device 220 is 151° C., a maximum temperature of the control device 210 may become 110° C. That is, a temperature difference between the power device 220 and the control device 210 becomes 41° C. As compared to the temperature difference between the power device 322 and the control device 321 of the heat radiating substrate 300 of FIG. 10 according to the prior art, the heat radiating substrate 100 of FIG. 3 according to another preferred embodiment of the present invention has higher efficiency in thermal separation between the power device 220 and the control device 210.

With the heat radiating substrate and the method for manufacturing the same according to the preferred embodiment of the present invention, the heat generated in the power device and conducted to the control device may be reduced by the plurality of holes formed under the control device. Therefore, defects of the control device by the heat generated in the power device may be prevented.

With the heat radiating substrate and the method for manufacturing the same according to the preferred embodiment of the present invention, the heat generated in the power device and conducted to the control device is reduced, such that reliability of the package may be improved at the time of packaging devices.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A heat radiating substrate comprising:
a heat radiating plate including a plurality of holes having a predetermined depth and formed in a lower portion of one side thereof;
a conductor pattern layer formed on the heat radiating plate and including mounting pads on which a control device and a power device are mounted and a circuit pattern; and
an insulating layer formed between the heat radiating plate and the conductor pattern layer,
wherein the heat radiating substrate includes the control device mounted in an upper portion of the heat radiating substrate, a first radiator which the plurality of holes having the predetermined depth are formed in the lower portion of the heat radiating substrate and a second radiator which is integrally formed at a side of the first radiator and mounts the power device of the upper portion of the heat radiating plate, and
wherein the plurality of holes of the first radiator, reduces heat conduction transferred to the first radiator through the second radiator, and protects the control device from the heat generated from the power device.

2. The heat radiating substrate as set forth in claim 1, wherein the heat radiating plate is made of a non-metal inorganic material.

3. The heat radiating substrate as set forth in claim 1, wherein the heat radiating plate is made of at least one of aluminum (Al), copper (Cu), molybdenum (Mo), tungsten (W), titanium (Ti), and magnesium (Mg).

4. The heat radiating substrate as set forth in claim 1, wherein an internal portion of the plurality of holes is filled with a heterogeneous material having thermal conductivity lower than that of the heat radiating plate.

5. The heat radiating substrate as set forth in claim 1, wherein an internal portion of the plurality of holes is filled with an epoxy resin.

6. A method for manufacturing a heat radiating substrate comprising:
preparing a heat radiating base plate;
forming a plurality of holes having a predetermined depth in a lower portion of one side of the heat radiating base plate to form a heat radiating plate;
forming an insulating layer on the heat radiating plate; and
forming a conductor pattern layer including mounting pads on which a control device and a power device are mounted and a circuit pattern on the insulating layer.

7. The method for manufacturing a heat radiating substrate as set forth in claim 6, wherein in the preparing of the heat radiating base plate, the heat radiating base plate is made of a non-metal inorganic material.

8. The method for manufacturing a heat radiating substrate as set forth in claim 6, wherein in the preparing of the heat radiating base plate, the heat radiating base plate is made of at least one of aluminum (Al), copper (Cu), molybdenum (Mo), tungsten (W), titanium (Ti), and magnesium (Mg).

9. The method for manufacturing a heat radiating substrate as set forth in claim 6, wherein in the forming of the heat radiating plate, the plurality of holes are formed by a drilling process.

10. The method for manufacturing a heat radiating substrate as set forth in claim 6, further comprising filling a heterogeneous material having thermal conductivity lower than that of the heat radiating plate in the plurality of the holes after the forming of the heat radiating plate.

11. The method for manufacturing a heat radiating substrate as set forth in claim 10, wherein in the filling of the heterogeneous material, the heterogeneous material is an epoxy resin.

12. The method for manufacturing a heat radiating substrate as set forth in claim 6, wherein in the forming of the conductor pattern layer, a mounting pad on which the control device is mounted is formed on the plurality of holes of the heat radiating plate.

* * * * *